(12) United States Patent
Kishimoto et al.

(10) Patent No.: US 12,439,823 B2
(45) Date of Patent: Oct. 7, 2025

(54) PIEZOELECTRIC DEVICE

(71) Applicant: Murata Manufacturing Co., Ltd., Nagaokakyo (JP)

(72) Inventors: Yutaka Kishimoto, Nagaokakyo (JP); Shinsuke Ikeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 730 days.

(21) Appl. No.: 17/883,742

(22) Filed: Aug. 9, 2022

(65) Prior Publication Data

US 2022/0384708 A1 Dec. 1, 2022

Related U.S. Application Data

(63) Continuation of application No. PCT/JP2021/006585, filed on Feb. 22, 2021.

(30) Foreign Application Priority Data

Feb. 26, 2020 (JP) .................................. 2020-030351

(51) Int. Cl.
*H10N 30/072* (2023.01)
*H04R 17/00* (2006.01)
(Continued)

(52) U.S. Cl.
CPC ........... *H10N 30/072* (2023.02); *H04R 17/00* (2013.01); *H10N 30/06* (2023.02); *H10N 30/50* (2023.02);
(Continued)

(58) Field of Classification Search
CPC .... H10N 30/50; H10N 30/871; H10N 30/072; H10N 30/06; H10N 30/086; H10N 30/87; H04R 17/00
See application file for complete search history.

(56) References Cited

U.S. PATENT DOCUMENTS

| | | | | |
|---|---|---|---|---|
| 7,436,272 | B2 * | 10/2008 | Fujii | H03H 3/02 333/186 |
| 8,727,510 | B2 * | 5/2014 | Hirai | B41J 2/14201 347/71 |

(Continued)

FOREIGN PATENT DOCUMENTS

| | | | | |
|---|---|---|---|---|
| CN | 117639701 A | * | 3/2024 | ........... H03H 9/1014 |
| GB | 2431512 A | * | 4/2007 | ............. H03H 9/173 |

(Continued)

OTHER PUBLICATIONS

International Search Report in PCT/JP2021/006585, mailed May 11, 2021, 3 pages.

(Continued)

*Primary Examiner* — Pedro J Cuevas
(74) *Attorney, Agent, or Firm* — Keating & Bennett, LLP

(57) ABSTRACT

In a piezoelectric device, a layered portion includes, at a position at least above a recess, a single crystal piezoelectric layer and a pair of electrode layers to apply voltage to the single crystal piezoelectric layer. At least a portion of the pair of electrode layers includes a lower electrode layer extending along a surface of the single crystal piezoelectric layer, the surface being closer to a base. The lower electrode layer is present only inside the recess.

20 Claims, 5 Drawing Sheets

(51) Int. Cl.
*H10N 30/06* (2023.01)
*H10N 30/50* (2023.01)
*H10N 30/853* (2023.01)
*H10N 30/87* (2023.01)

(52) U.S. Cl.
CPC ......... *H10N 30/8542* (2023.02); *H10N 30/87* (2023.02); *H10N 30/871* (2023.02)

(56) References Cited

U.S. PATENT DOCUMENTS

| | | | | |
|---|---|---|---|---|
| 9,144,977 | B2* | 9/2015 | Hirai | B41J 2/161 |
| 9,498,952 | B2* | 11/2016 | Hirai | B41J 2/045 |
| 10,059,101 | B2* | 8/2018 | Hirai | B41J 2/161 |
| 10,530,333 | B2* | 1/2020 | Kishimoto | H03H 3/08 |
| 11,806,750 | B2* | 11/2023 | Kishimoto | H10N 30/708 |
| 11,856,365 | B2* | 12/2023 | Ikeuchi | H10N 30/088 |
| 11,979,713 | B2* | 5/2024 | Umezawa | H03H 9/17 |
| 12,178,132 | B2* | 12/2024 | Kishimoto | H10N 30/877 |
| 12,262,176 | B2* | 3/2025 | Umezawa | H04R 17/02 |
| 12,275,040 | B2* | 4/2025 | Umezawa | H04R 17/00 |
| 2004/0232802 | A1* | 11/2004 | Koshido | H03H 9/6483 |
| | | | | 29/25.35 |
| 2007/0058826 | A1* | 3/2007 | Sawamoto | H04R 19/04 |
| | | | | 381/174 |
| 2007/0096605 | A1 | 5/2007 | Fuji et al. | |
| 2009/0213188 | A1* | 8/2009 | Shimada | B41J 2/1631 |
| | | | | 347/71 |
| 2012/0205754 | A1* | 8/2012 | Iwamoto | H03H 3/02 |
| | | | | 257/E21.001 |
| 2013/0194353 | A1* | 8/2013 | Hirai | B41J 2/14233 |
| | | | | 347/71 |
| 2014/0210916 | A1* | 7/2014 | Hirai | B41J 2/14233 |
| | | | | 347/71 |
| 2015/0085024 | A1* | 3/2015 | Hirai | B41J 2/1646 |
| | | | | 310/331 |
| 2015/0367643 | A1* | 12/2015 | Hirai | B41J 2/14201 |
| | | | | 347/71 |
| 2016/0075137 | A1* | 3/2016 | Hirai | H10N 30/871 |
| | | | | 347/70 |
| 2017/0036446 | A1* | 2/2017 | Hirai | B41J 2/14201 |
| 2017/0069820 | A1* | 3/2017 | Hada | H03H 9/174 |
| 2017/0184718 | A1* | 6/2017 | Horsley | B06B 1/0292 |
| 2017/0264266 | A1* | 9/2017 | Kishimoto | H03H 3/08 |
| 2019/0193116 | A1* | 6/2019 | Horsley | G10K 9/122 |
| 2021/0143315 | A1* | 5/2021 | Kishimoto | H10N 30/87 |
| 2021/0146402 | A1* | 5/2021 | Kishimoto | H10N 30/875 |
| 2021/0343929 | A1* | 11/2021 | Kishimoto | H10N 30/877 |
| 2022/0040736 | A1* | 2/2022 | Umezawa | B06B 1/0666 |
| 2022/0271728 | A1* | 8/2022 | Kishimoto | H03H 9/131 |
| 2022/0303693 | A1* | 9/2022 | Ikeuchi | H04R 17/02 |
| 2022/0329951 | A1* | 10/2022 | Umezawa | H03H 9/17 |
| 2022/0384707 | A1* | 12/2022 | Kishimoto | H10N 30/871 |
| 2023/0038607 | A1* | 2/2023 | Umezawa | H10N 30/85 |
| 2023/0043420 | A1* | 2/2023 | Kishimoto | H10N 30/853 |
| 2023/0199405 | A1* | 6/2023 | Umezawa | H04R 17/00 |
| | | | | 381/173 |
| 2023/0382114 | A1* | 11/2023 | Yamazaki | B41J 2/14233 |
| 2024/0080009 | A1* | 3/2024 | Iyama | H03H 9/02062 |
| 2024/0088860 | A1* | 3/2024 | Moe | H03H 9/105 |
| 2024/0088864 | A1* | 3/2024 | Inoue | H03H 9/176 |
| 2024/0278564 | A1* | 8/2024 | Mikoshiba | B41J 2/14233 |
| 2024/0284121 | A1* | 8/2024 | Ikeuchi | H04R 17/10 |
| 2025/0080918 | A1* | 3/2025 | Bahr | H10N 30/063 |

FOREIGN PATENT DOCUMENTS

| | | | | |
|---|---|---|---|---|
| JP | 2009225232 | A | | 10/2009 |
| JP | 2012028976 | A | * | 2/2012 |
| JP | 2013005250 | A | | 1/2013 |
| JP | 2015156626 | A | | 8/2015 |
| WO | WO-2006001125 | A1 | * | 1/2006 ............ H03H 9/173 |
| WO | WO-2021166837 | A1 | * | 8/2021 ......... H10N 30/2047 |

OTHER PUBLICATIONS

Lu et al., "Modeling, Fabrication, and Characterization of Piezoelectric Micromachined Ultrasonic Transducer Arrays Based on Cavity SOI Wafers", Journal of Microelectromechanical Systems, Aug. 2014, vol. 24, No. 4, 8 pages.

Written Opinion in PCT/JP2021/006585, mailed May 11, 2021, 4 pages.

* cited by examiner

_US 12,439,823 B2_

PIEZOELECTRIC DEVICE

CROSS REFERENCE TO RELATED APPLICATIONS

This application claims the benefit of priority to Japanese Patent Application No. 2020-030351 filed on Feb. 26, 2020 and is a Continuation Applications of PCT Application No. PCT/JP2021/006585 filed on Feb. 22, 2021. The entire contents of each application are hereby incorporated herein by reference.

BACKGROUND OF THE INVENTION

1. Field of the Invention

The present invention relates to a piezoelectric device.

2. Description of the Related Art

The structure of a piezoelectric device is described in "Modeling, Fabrication, and Characterization of Piezoelectric Micromachined Ultrasonic Transducer Arrays Based on Cavity SOI Wafers", Y. Lu et al., Journal Microelectromechanical Systems, vol. 24, No. 4, August 2015, p. 1143-1149.

The piezoelectric device described in "Modeling, Fabrication, and Characterization of Piezoelectric Micromachined Ultrasonic Transducer Arrays Based on Cavity SOI Wafers", Y. Lu et al., Journal Microelectromechanical Systems, vol. 24, No. 4, August 2015, p. 1143-1149 includes an SOI substrate having a cavity, a piezoelectric layer disposed at least above the cavity, an upper electrode layer disposed on an upper surface of the piezoelectric layer, and a lower electrode layer disposed on a surface of the piezoelectric layer, the surface being opposite to the upper surface. The lower electrode layer is exposed on the SOI substrate at the periphery thereof.

SUMMARY OF THE INVENTION

In the piezoelectric device described in "Modeling, Fabrication, and Characterization of Piezoelectric Micromachined Ultrasonic Transducer Arrays Based on Cavity SOI Wafers", Y. Lu et al., Journal Microelectromechanical Systems, vol. 24, No. 4, August 2015, p. 1143-1149, when a voltage is applied between the upper electrode layer and the lower electrode layer to vibrate the piezoelectric layer, the vibration is transmitted through the lower electrode layer to the periphery of the piezoelectric device and the vibration is thereby attenuated, which lowers the excitation efficiency of the piezoelectric device.

Preferred embodiments of the present invention provide piezoelectric devices each achieving a high excitation efficiency.

According to a preferred embodiment of the present invention, a piezoelectric device includes a base and a layered portion. The base includes a first principal surface and a second principal surface positioned opposite to the first principal surface and also has a recess at the first principal surface. The layered portion is layered on the first principal surface of the base so as to cover the recess from above. The layered portion includes, at a position at least above the recess, a single crystal piezoelectric layer and a pair of electrode layers to apply voltage to the single crystal piezoelectric layer. At least a portion of the pair of electrode layers is a lower electrode layer, and the lower electrode layer extends along a surface of the single crystal piezoelectric layer, the surface being closer to the base. The lower electrode layer is present only inside the recess.

According to preferred embodiments of the present invention, the excitation efficiency of the piezoelectric device is improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
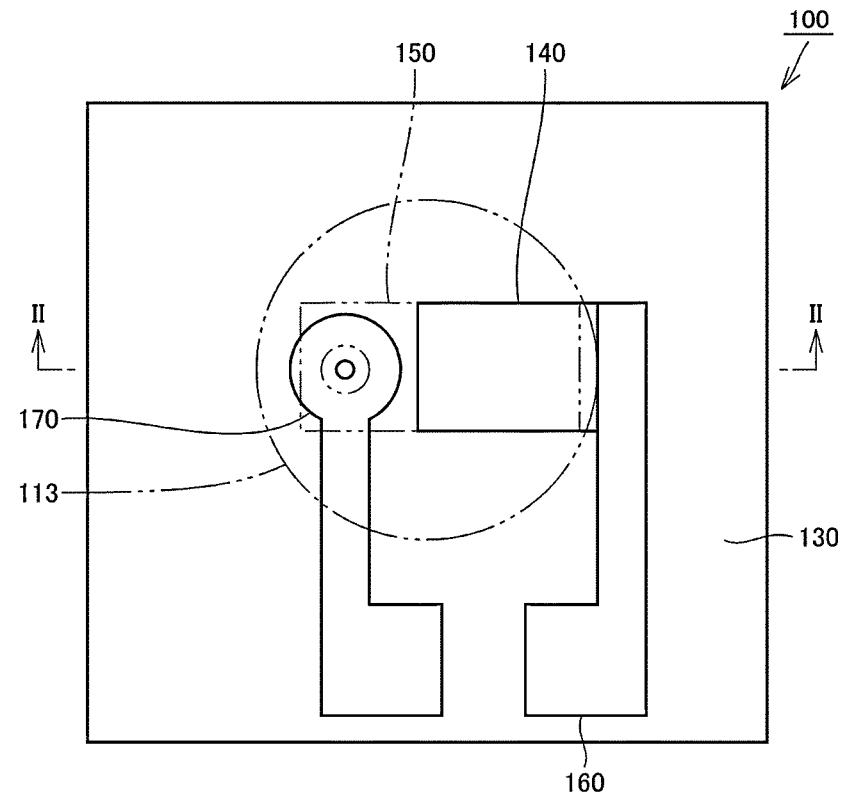
FIG. 1 is a plan view illustrating a structure of a piezoelectric device according to a first preferred embodiment of the present invention.

A piezoelectric device of each preferred embodiment of the present invention will be described in accordance with the drawings. In the drawings, the same or equivalent elements will be denoted by the same reference signs and duplicated descriptions will be omitted.

First Preferred Embodiment

Figure 2:
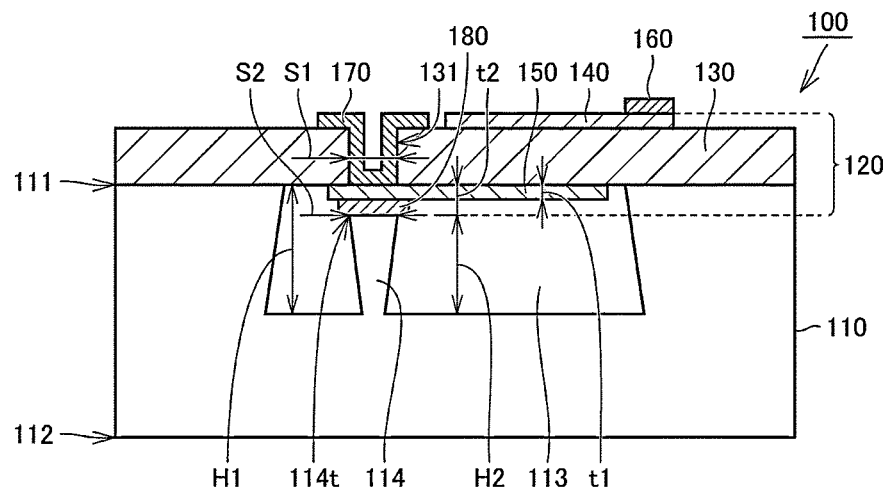
FIG. 2 is a cross-sectional view illustrating the piezoelectric device of FIG. 1, the view being taken along line II-II and viewed in the arrow direction.

FIG. 1 is a plan view illustrating a structure of a piezoelectric device according to the first preferred embodiment of the present invention. FIG. 2 is a cross-sectional view illustrating the piezoelectric device of FIG. 1, the view being taken along line II-II and viewed in the arrow direction.

As illustrated in FIGS. 1 and 2, a piezoelectric device 100 according to the first preferred embodiment of the present invention includes a base 110 and a layered portion 120.

The base 110 includes one principal surface 111 and the other principal surface 112 positioned opposite to the one principal surface 111. The base 110 has a recess 113 formed at the one principal surface 111. In the present preferred embodiment, the periphery of the recess 113 is shaped like a circle, or may be shaped like an oval or a polygon, as viewed in a direction orthogonal to the one principal surface 111.

In the present preferred embodiment, the width of the opening of the recess 113 at the one principal surface 111 is smaller than the width of the bottom of the recess 113. In the recess 113, however, the width of the opening may be equal to or greater than the width of the bottom. Note that a term "above the recess 113" may refer to a region positioned above the opening of the recess 113.

As illustrated in FIG. 2, the layered portion 120 is layered on the one principal surface 111 of the base 110, and the recess 113 is thereby covered with the layered portion 120 from above. In the present preferred embodiment, the interior space of the recess 113 is a sealed space.

According to the piezoelectric device 100 of the present preferred embodiment, a negative pressure is applied to the interior space of the recess 113. The pressure in the recess 113, however, may be an atmospheric pressure or may be a positive pressure.

In the present preferred embodiment, the base 110 is made of Si. The material of the base 110, however, is not limited to Si.

The layered portion 120 includes a single crystal piezoelectric layer 130 and a pair of electrode layers. The pair of electrode layers applies a voltage to the single crystal piezoelectric layer 130. In the present preferred embodiment, the pair of electrode layers includes an upper electrode layer 140 and a lower electrode layer 150.

The single crystal piezoelectric layer 130 is positioned above the base 110. The single crystal piezoelectric layer 130 is disposed such that at least a portion of the single crystal piezoelectric layer 130 is above the recess 113. A hole 131 is formed through the single crystal piezoelectric layer 130 from the one principal surface 111 of the base 110 to the other principal surface 112 of the base 110 at a position above the lower electrode layer 150.

The single crystal piezoelectric layer 130 is made of lithium tantalate or lithium niobate. The single crystal piezoelectric layer 130 made of lithium tantalate or lithium niobate provides a uniform polarization state. The single crystal piezoelectric layer 130 may be made of rock crystal.

The upper electrode layer 140 is positioned on the upper surface of the single crystal piezoelectric layer 130. The upper electrode layer 140 is disposed such that at least a portion of the upper electrode layer 140 is above the recess 113.

In the present preferred embodiment, the upper electrode layer 140 is positioned above a portion of the single crystal piezoelectric layer 130. Note that an adhesion layer made, for example, of Ti, Cr, Ni, or NiCr, may be disposed between the upper electrode layer 140 and the single crystal piezoelectric layer 130. For example, the upper electrode layer 140 is made of a metal, such as Al or Pt.

The upper electrode layer 140 is connected to first extended wiring 160. The first extended wiring 160 is connected to the upper surface of the upper electrode layer 140 at a position above the base 110 and extended along a surface of the single crystal piezoelectric layer 130, the surface being positioned opposite to the base 110.

For example, the first extended wiring 160 is made of a metal, such as Au. An adhesion layer may be formed between the first extended wiring 160 and the upper electrode layer 140. The adhesion layer is made, for example, of Ti, Cr, Ni, or NiCr. The first extended wiring 160 and the upper electrode layer 140 are in ohmic contact with each other.

The lower electrode layer 150 is disposed so as to oppose at least a portion of the upper electrode layer 140 with the single crystal piezoelectric layer 130 being interposed therebetween. In the present preferred embodiment, the lower electrode layer 150 includes a portion of the pair of electrode layers. The lower electrode layer 150 extends along a surface of the single crystal piezoelectric layer 130, the surface being closer to the base 110. The lower electrode layer 150 is positioned only within the recess 113. The lower electrode layer 150 is positioned in an upper region in the recess 113 so as to oppose at least a portion of the upper electrode layer 140 with the single crystal piezoelectric layer 130 being interposed therebetween.

A portion of the lower electrode layer 150 is positioned under the hole 131 extending through the single crystal piezoelectric layer 130. In the present preferred embodiment, the lower electrode layer 150 is formed so as to cover the hole 131 of the single crystal piezoelectric layer 130 from below. For example, the lower electrode layer 150 is made of a metal, such as Al or Pt.

In the present preferred embodiment, a second extended wiring 170 is formed in the hole 131, and the second extended wiring 170 is electrically connected to the lower electrode layer 150. More specifically, the second extended wiring 170 is connected to the upper surface of the lower electrode layer 150 in the hole 131. The second extended wiring 170 covers the inside surface of the hole 131 and is extended along the surface of the single crystal piezoelectric layer 130 that is opposite to the surface near the base 110.

For example, the second extended wiring 170 is made of a metal, such as Au. An adhesion layer may be formed between the second extended wiring 170 and the lower electrode layer 150. The adhesion layer is made, for example, of Ti, Cr, Ni, or NiCr. The second extended wiring 170 and the lower electrode layer 150 are in ohmic contact with each other.

Note that the lower electrode layer 150 may be formed so as to cover the bottom of the hole 131 of the single crystal piezoelectric layer 130 with an adhesion layer interposed therebetween. The material of the adhesion layer is not specifically limited insofar as the material has electric conductivity and adhesiveness. For example, the adhesion layer is made of Ti, Cr, Ni, or NiCr.

In the present preferred embodiment, the base 110 includes a protrusion 114 that protrudes into the recess 113 from the bottom thereof. The protrusion 114, however, is not necessarily provided. When the depth of the recess 113 is H1 and the height of the protrusion 114 from the bottom of the recess 113 is H2 as illustrated in FIG. 2, H2<H1 is satisfied.

The protrusion 114 is shaped like a frustum. In the present preferred embodiment, the area of a transverse section of the protrusion 114 becomes greater as the distance from the bottom of the recess 113 becomes greater. The area of the transverse section of the protrusion 114, however, may become smaller as the distance from the bottom of the recess 113 becomes greater. Alternatively, the area of the transverse section of the protrusion 114 may be constant irrespective of the distance from the bottom of the recess 113.

When the hole 131 is viewed in the direction orthogonal to the one principal surface 111, the entire area inside the hole 131 overlaps a top surface 114t of the protrusion 114. As illustrated in FIG. 2, when the hole 131 is viewed in the direction orthogonal to the one principal surface 111, the area inside the hole 131 is S1, and the area of the top surface 114t of the protrusion 114 is S2. In this case, S2≥S1 is satisfied.

In the present preferred embodiment, a reinforcing lower electrode layer 180 may be provided between the lower electrode layer 150 and the top surface 114t of the protrusion 114. The reinforcing lower electrode layer 180, however, is not necessarily provided. The reinforcing lower electrode layer 180 need not have electric conductivity and need not be made of a metal.

As illustrated in FIG. 2, t1 is the thickness of a portion of the lower electrode layer 150 that applies voltage to the single crystal piezoelectric layer 130, and t2 is a total thickness of the lower electrode layer 150 and the reinforcing lower electrode layer 180 at a position between the hole 131 and the top surface 114t of the protrusion 114. In this case, t2>t1 is satisfied.

The portion of the lower electrode layer that includes the lower electrode layer 150 and the reinforcing lower electrode layer 180 at the position between hole 131 and the top surface 114t of the protrusion 114 is thicker than the portion of the lower electrode layer 150 that applies voltage to the single crystal piezoelectric layer 130.

In the case of the reinforcing lower electrode layer 180 being not provided, the portion of the lower electrode layer 150 positioned between the hole 131 and the top surface 114t of the protrusion 114 is thicker than the portion of the lower electrode layer 150 that applies voltage to the single crystal piezoelectric layer 130.

The top surface 114t of the protrusion 114 is in contact with the lower electrode layer. In the present preferred embodiment, the top surface 114t of the protrusion 114 is in contact with the reinforcing lower electrode layer 180.

Next, an example method of manufacturing the piezoelectric device 100 according to the first preferred embodiment of the present invention will be described.

Figure 3:
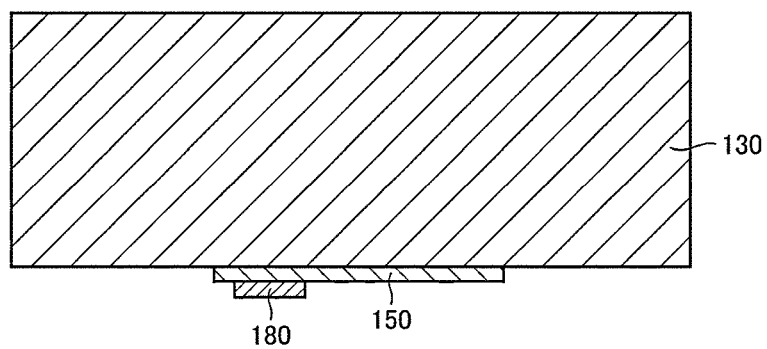
FIG. 3 is a cross-sectional view illustrating a state of a single crystal piezoelectric layer in which a lower electrode layer is formed on the lower surface thereof in accordance with a method of manufacturing the piezoelectric device of the first preferred embodiment of the present invention.

FIG. 3 is a cross-sectional view illustrating a state of the single crystal piezoelectric layer in which the lower electrode layer is formed at the lower surface thereof in accordance with the method of manufacturing the piezoelectric device of the first preferred embodiment of the present invention. The thickness of the single crystal piezoelectric layer 130 provided is greater than the final thickness of the single crystal piezoelectric layer 130 to be included in the piezoelectric device 100 of the present preferred embodiment.

As illustrated in FIG. 3, the lower electrode layer 150 is formed on the lower surface of the single crystal piezoelectric layer 130, for example, by using the lift-off method, plating, or etching. In the present preferred embodiment, the reinforcing lower electrode layer 180 is also formed on a portion of the lower surface of the lower electrode layer 150.

Figure 4:
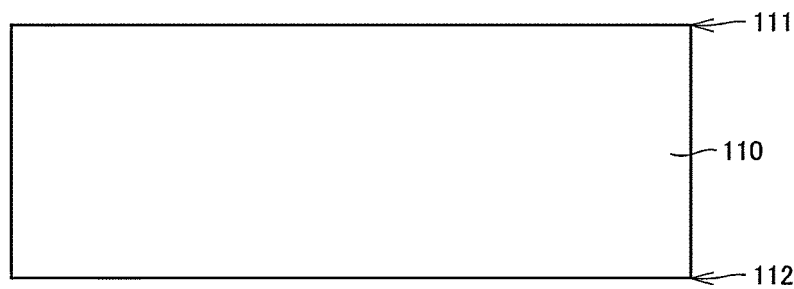
FIG. 4 is a cross-sectional view illustrating a state of a base before a recess and a protrusion are formed therein in accordance with the method of manufacturing the piezoelectric device of the first preferred embodiment of the present invention.
Figure 5:
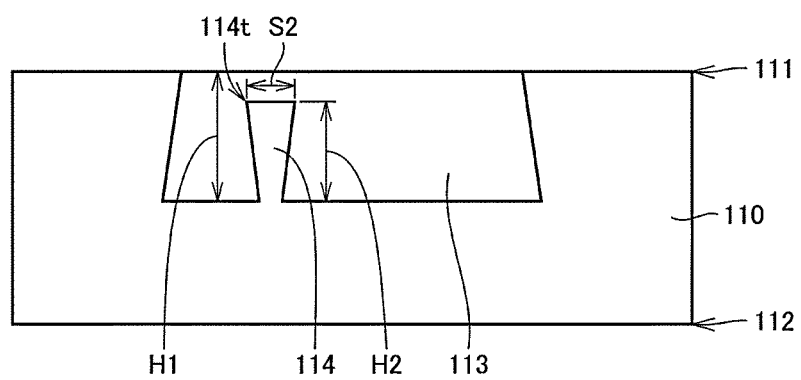
FIG. 5 is a cross-sectional view illustrating a state of the base after the recess and the protrusion are formed therein in accordance with the method of manufacturing the piezoelectric device of the first preferred embodiment of the present invention.

FIG. 4 is a cross-sectional view illustrating a state of the base before the recess and the protrusion are formed therein in accordance with the method of manufacturing the piezoelectric device of the first preferred embodiment of the present invention. FIG. 5 is a cross-sectional view illustrating a state of the base after the recess and the protrusion are formed therein in accordance with the method of manufacturing the piezoelectric device of the first preferred embodiment of the present invention.

As illustrated in FIGS. 3 and 4, the recess 113 and the protrusion 114 are etched into the base 110 from the one principal surface 111 thereof, for example, using deep reactive ion etching (DRIE).

Figure 6:
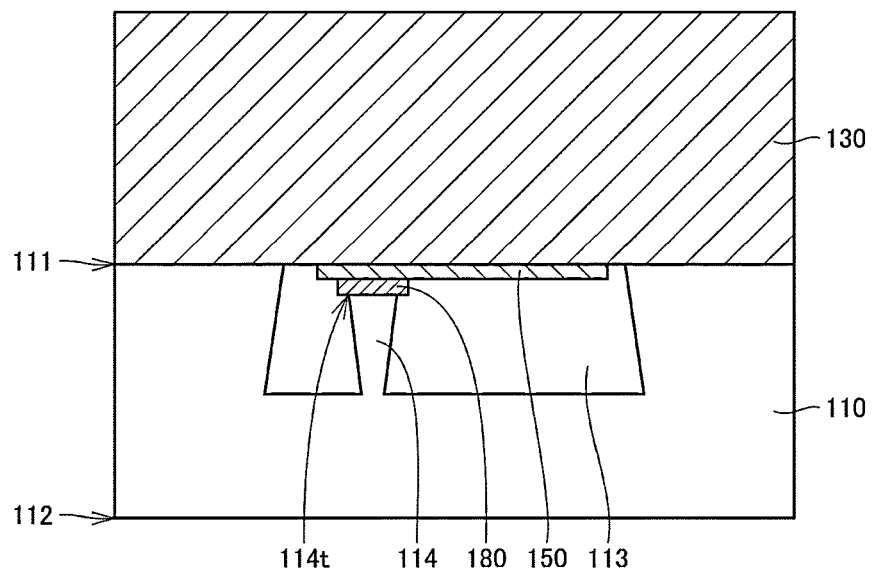
FIG. 6 is a cross-sectional view illustrating a state in which the base has been bonded to the lower surface of the single crystal piezoelectric layer in accordance with the method of manufacturing the piezoelectric device of the first preferred embodiment of the present invention.

FIG. 6 is a cross-sectional view illustrating a state in which the base has been bonded to the lower surface of the single crystal piezoelectric layer in accordance with the method of manufacturing the piezoelectric device of the first preferred embodiment of the present invention.

As illustrated in FIG. 6, the one principal surface 111 of the base 110 is bonded to the lower surface of the single crystal piezoelectric layer 130, for example, by surface activated bonding or atomic diffusion bonding. A bonding layer made of Ti or the like may be formed between the bonding surfaces. The interior space of the recess 113 is thereby sealed. In this state, the reinforcing lower electrode layer 180 is in contact with the top surface 114t of the protrusion 114. Note that the reinforcing lower electrode layer 180 is not bonded to the top surface 114t of the protrusion 114 but is detachable therefrom.

In the present preferred embodiment, the single crystal piezoelectric layer 130 and the base 110 are bonded together under a vacuum to prevent foreign matter from entering the recess 113. In this case, the degree of vacuum may be any of low vacuum, medium vacuum, high vacuum, and ultra-high vacuum. The single crystal piezoelectric layer 130 and the base 110 are bonded together in such an atmosphere, which makes the pressure negative in the recess 113.

Note that when the single crystal piezoelectric layer 130 and the base 110 are bonded together, the atmosphere is not limited to a vacuum. The single crystal piezoelectric layer 130 may be bonded to the base 110 under atmospheric pressure or under a pressure higher than atmospheric pressure.

Figure 7:
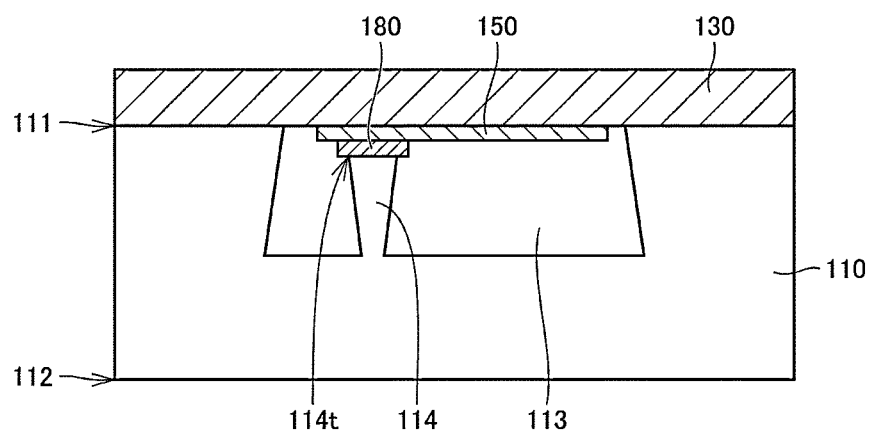
FIG. 7 is a cross-sectional view illustrating a state in which the upper surface of the single crystal piezoelectric layer has been polished in accordance with the method of manufacturing the piezoelectric device of the first preferred embodiment of the present invention.

FIG. 7 is a cross-sectional view illustrating a state in which the upper surface of the single crystal piezoelectric layer has been polished in accordance with the method of manufacturing the piezoelectric device of the first preferred embodiment of the present invention. As illustrated in FIG. 7, the upper surface of the single crystal piezoelectric layer 130 is polished, for example, by chemical mechanical polishing (CMP). In this case, the thickness of the single crystal piezoelectric layer 130 is adjusted so as to obtain a desired amount of expansion and contraction of the single crystal piezoelectric layer 130 under voltage application.

A release layer may be formed in advance by ion injection at the upper surface of the single crystal piezoelectric layer 130. A layer of the single crystal piezoelectric layer 130 can be peeled off at the release layer before the upper surface is polished by CMP, which makes it easier to adjust the thickness of the single crystal piezoelectric layer 130.

Figure 8:
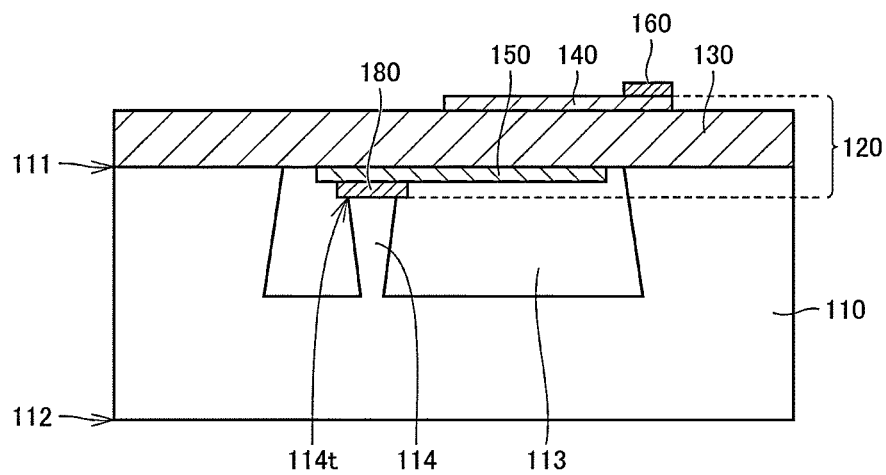
FIG. 8 is a cross-sectional view illustrating a state in which an upper electrode layer has been formed on the upper surface of the single crystal piezoelectric layer in accordance with the method of manufacturing the piezoelectric device of the first preferred embodiment of the present invention.

FIG. 8 is a cross-sectional view illustrating a state in which the upper electrode layer has been formed on the upper surface of the single crystal piezoelectric layer in accordance with the method of manufacturing the piezoelectric device of the first preferred embodiment of the present invention. As illustrated in FIG. 8, the upper electrode layer 140 is formed on a portion of the upper surface of the single crystal piezoelectric layer 130, for example, by using the lift-off method, plating, or etching. The layered portion 120 is thus layered on the one principal surface 111 of the base 110. A piercing slit in communication with the recess 113 may be formed in the layered portion 120 using reactive ion etching (RIE).

Subsequently, the first extended wiring 160 is formed using the photolithography or the lift-off method so as to come into contact with the upper surface of the portion of the upper electrode layer 140 that is positioned above the base 110.

Figure 9:
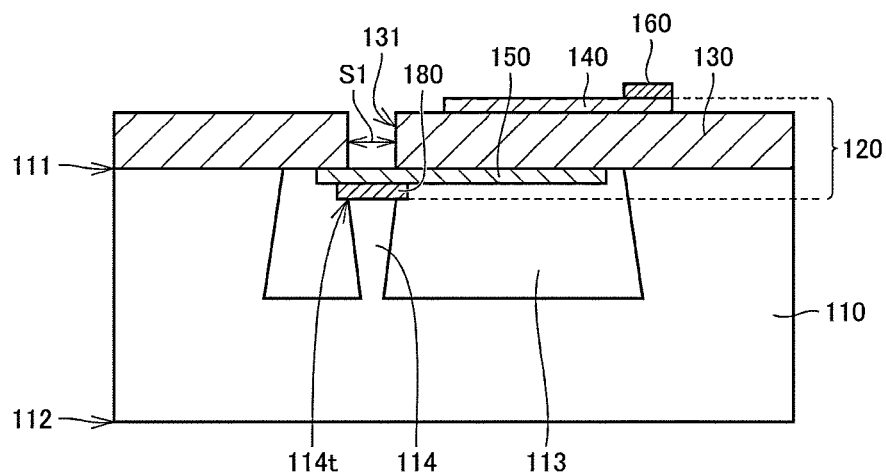
FIG. 9 is a cross-sectional view illustrating a state in which a hole has been formed in the single crystal piezoelectric layer in accordance with the method of manufacturing the piezoelectric device of the first preferred embodiment of the present invention.

FIG. 9 is a cross-sectional view illustrating a state in which the hole has been formed in the single crystal piezoelectric layer in accordance with the method of manufacturing the piezoelectric device of the first preferred embodiment of the present invention. As illustrated in FIG. 9, the hole 131 is formed through the single crystal piezoelectric layer 130 by etching, such as RIE.

Finally, the second extended wiring 170 is formed, for example, using the photolithography or the lift-off method. Thus, the piezoelectric device 100 of the first preferred embodiment of the present invention as illustrated in FIG. 2 is manufactured through the steps described above.

As described above, in the piezoelectric device 100 according to the present preferred embodiment, the lower electrode layer 150 is present only within the recess 113. Accordingly, when the upper electrode layer 140 and the lower electrode layer 150 apply voltage and cause the single crystal piezoelectric layer 130 to vibrate, this reduces the likelihood of the vibration being transmitted through the lower electrode layer 150 to the periphery of the piezoelectric device 100 and thereby reduces the likelihood of the vibration being attenuated. Accordingly, this can improve the excitation efficiency of the piezoelectric device 100.

In the piezoelectric device 100 according to the present preferred embodiment, the base 110 includes the protrusion 114 that protrudes into the recess 113 from the bottom thereof, and the top surface 114t of the protrusion 114 is in contact with the lower electrode layer. Accordingly, the protrusion 114 supports the layered portion 120, which can reduce the likelihood of the layered portion 120 being bent toward the recess 113.

In the piezoelectric device 100 according to the present preferred embodiment, the hole 131 extends through the single crystal piezoelectric layer 130 from the one principal surface 111 of the base 110 to the other principal surface 112 of the base 110 at a position above the lower electrode layer 150. The second extended wiring 170 is formed in the hole 131 and electrically connected to the lower electrode layer 150. In addition, when the hole 131 is viewed in the direction orthogonal to the one principal surface 111, the hole 131 entirely overlaps the top surface 114t of the protrusion 114. This enables the protrusion 114 to support the reinforcing lower electrode layer 180, the lower electrode layer 150, and the second extended wiring 170, which can reduce the likelihood of cracks occurring in the layered portion 120 during the formation of the second extended wiring 170.

In the piezoelectric device 100 according to the present preferred embodiment, the portion of the lower electrode layer that is positioned between the hole 131 and the top surface 114t of the protrusion 114 is thicker than the portion of the lower electrode layer that applies voltage to the single crystal piezoelectric layer 130. This can reinforce the extension portion of the lower electrode layer and thereby improve the reliability of the piezoelectric device 100.

In the piezoelectric device 100 according to the present preferred embodiment, the interior space of the recess 113 is sealed, which can reduce the likelihood of foreign matter entering the recess 113.

In the piezoelectric device 100 according to the present preferred embodiment, the single crystal piezoelectric layer 130 is made of lithium tantalate, lithium niobate, or rock crystal, which can uniformize the polarization state of the single crystal piezoelectric layer 130 and thereby improve the excitation characteristics of the piezoelectric device 100.

Second Preferred Embodiment

A piezoelectric device of second preferred embodiment of the present invention will be described with reference to the drawings. The piezoelectric device of the second preferred embodiment of the present invention is different from the piezoelectric device 100 of the first preferred embodiment of the present invention mainly in that the pair of electrode layers consists only of lower electrode layers. Duplicated descriptions will be omitted for the elements similar to those of the piezoelectric device 100 of the first preferred embodiment of the present invention.

Figure 10:
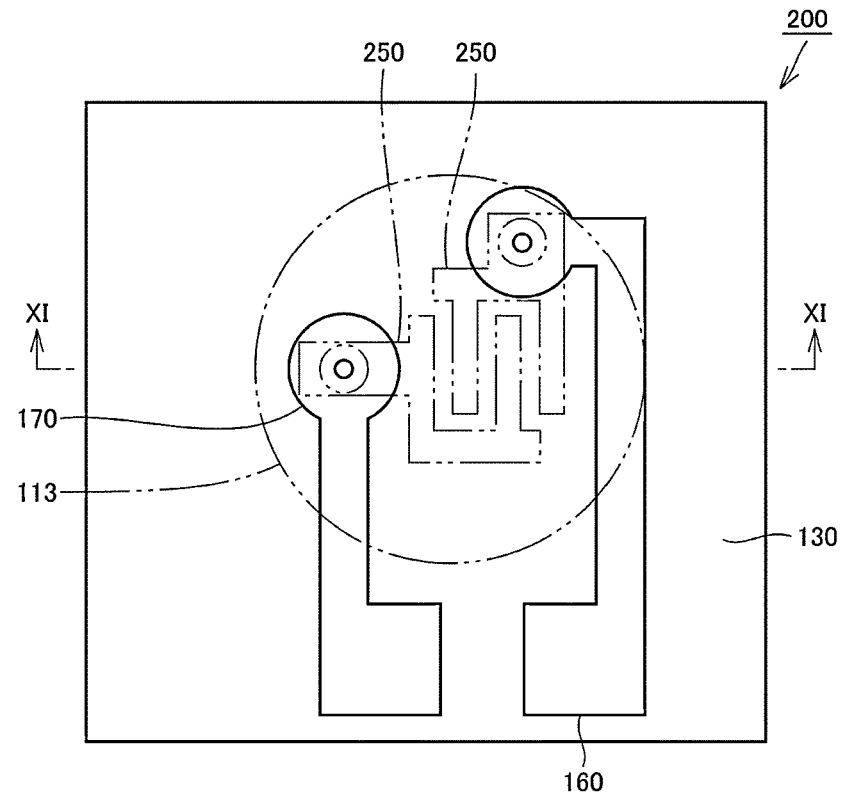
FIG. 10 is a plan view illustrating a structure of a piezoelectric device according to a second preferred embodiment of the present invention.
Figure 11:
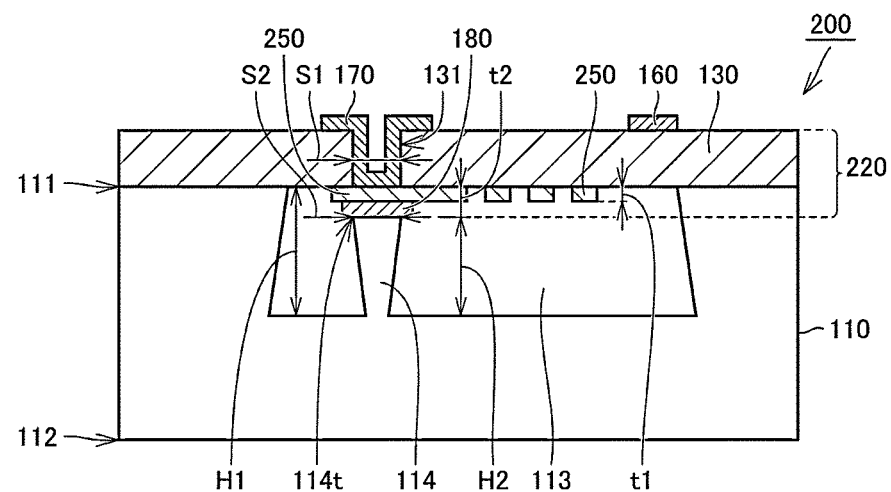
FIG. 11 is a cross-sectional view illustrating the piezoelectric device of FIG. 10, the view being taken along line XI-XI and viewed in the arrow direction.

FIG. 10 is a plan view illustrating a structure of a piezoelectric device according to the second preferred embodiment of the present invention. FIG. 11 is a cross-sectional view illustrating the piezoelectric device of FIG. 10, the view being taken along line XI-XI and viewed in the arrow direction.

As illustrated in FIGS. 10 and 11, a piezoelectric device 200 according to the second preferred embodiment of the present invention includes the base 110 and a layered portion 220.

The layered portion 220 includes the single crystal piezoelectric layer 130 and a pair of electrode layers. The pair of electrode layers applies a voltage to the single crystal piezoelectric layer 130. In the present preferred embodiment, the pair of electrode layers may include only lower electrode layers 250. As illustrated in FIG. 10, the lower electrode layers 250 define a pair of comb-shaped electrode layers. The pair of comb-shaped electrode layers applies a voltage to portions of the single crystal piezoelectric layer 130 that are positioned between the comb-shaped electrode layers.

The hole 131 and another hole are formed through the single crystal piezoelectric layer 130. The hole 131 is positioned above one electrode of the pair, and the other hole is positioned above the other electrode of the pair. As illustrated in FIG. 10, the first extended wiring 160 is connected to the upper surface of the lower electrode layer 250 inside the other hole, as is the case for the second extended wiring 170. The first extended wiring 160 covers the inside surface of the other hole and is extended along a surface of the single crystal piezoelectric layer 130, the surface being opposite to the surface near the base 110. Another protrusion and another reinforcing lower electrode layer are formed under the other hole. This enables the other protrusion to support the other reinforcing lower electrode layer, the lower electrode layer 250, and the first extended wiring 160, which can reduce the likelihood of cracks occurring in the layered portion 220 during the formation of the first extended wiring 160.

According to the piezoelectric device 200 of the second preferred embodiment of the present invention, the pair of electrode layers may include only the lower electrode layers 250 and may be disposed in the sealed space inside the recess 113. This can protect the pair of electrode layers and thereby improve the environmental tolerance of the piezoelectric device 200.

Configurations described in the above preferred embodiments may be combined with each other if feasible.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
a base including:
a first principal surface and a second principal surface positioned opposite to the first principal surface; and
a recess at the first principal surface; and
a layered portion provided on the first principal surface of the base so as to cover the recess from above; wherein
the layered portion includes, at a position at least above the recess, a single crystal piezoelectric layer and a pair of electrode layers to apply voltage to the single crystal piezoelectric layer;
at least a portion of the pair of electrode layers includes a lower electrode layer;
the lower electrode layer extends along a surface of the single crystal piezoelectric layer, the surface being closer to the base; and
the lower electrode layer is present only inside the recess.

2. The piezoelectric device according to claim 1, wherein
the base includes a protrusion protruding into the recess from a bottom of the recess; and
the protrusion includes a top surface that is in contact with the lower electrode layer.

3. The piezoelectric device according to claim 2, wherein
the single crystal piezoelectric layer has a hole extending therethrough from the first principal surface to the second principal surface at a position above the lower electrode layer;
extended wiring is provided in the hole and is electrically connected to the lower electrode layer; and
when the hole is viewed in a direction orthogonal to the first principal surface, the hole entirely overlaps the top surface of the protrusion.

4. The piezoelectric device according to claim 3, wherein a portion of the lower electrode layer positioned between the hole and the top surface of the protrusion is thicker than a portion of the lower electrode layer that applies voltage to the single crystal piezoelectric layer.

5. The piezoelectric device according to claim 3, wherein a portion of the lower electrode layer is positioned under the hole extending through the single crystal piezoelectric layer and covers the hole from below.

6. The piezoelectric device according to claim 1, wherein the single crystal piezoelectric layer is made of lithium tantalate, lithium niobate, or rock crystal.

7. The piezoelectric device according to claim 1, wherein the recess has a shape of a circle, an oval or a polygon.

8. The piezoelectric device according to claim 1, wherein a width of an opening of the recess is smaller than a width of a bottom of the recess.

9. The piezoelectric device according to claim 1, wherein a width of an opening of the recess is equal to a width of a bottom of the recess.

10. The piezoelectric device according to claim 1, wherein a width of an opening of the recess is larger than a width of a bottom of the recess.

11. The piezoelectric device according to claim 1, wherein an interior of the recess is sealed.

12. The piezoelectric device according to claim 1, wherein an interior of the recess is under negative pressure.

13. The piezoelectric device according to claim 1, wherein an interior of the recess is under atmospheric pressure.

14. The piezoelectric device according to claim 1, wherein an interior of the recess is under positive pressure.

15. The piezoelectric device according to claim 1, wherein a portion of the single crystal layer is above the recess.

16. The piezoelectric device according to claim 1, wherein at least a portion of the pair of electrode layers includes an upper electrode layer on an upper surface of the single crystal piezoelectric layer above the recess.

17. The piezoelectric device according to claim 16, wherein the lower electrode layer is positioned in an upper region in the recess so as to oppose at least a portion of the upper electrode layer with the single crystal piezoelectric layer being interposed therebetween.

18. The piezoelectric device according to claim 1, wherein the pair of electrode layers includes only lower electrode layers.

19. The piezoelectric device according to claim 1, wherein the pair of electrode layers includes only a pair of comb-shaped electrode layers.

20. The piezoelectric device according to claim 1, wherein the single crystal piezoelectric layer includes a first hole above a first of the pair of electrode layers and a second hole above a second of the pair of electrode layers.

* * * * *